United States Patent
Li

(10) Patent No.: US 11,244,865 B1
(45) Date of Patent: Feb. 8, 2022

(54) METHOD FOR MAKING SELF-ALIGNED POST-CUT SDB FINFET DEVICE

(71) Applicant: SHANGHAI HUALI INTEGRATED CIRCUIT CORPORATION, Shanghai (CN)

(72) Inventor: Yong Li, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/027,126

(22) Filed: Sep. 21, 2020

(30) Foreign Application Priority Data

Jul. 27, 2020 (CN) .......................... 202010729632.7

(51) Int. Cl.
*H01L 21/8238* (2006.01)
*H01L 21/8234* (2006.01)
*H01L 21/764* (2006.01)
*H01L 21/3205* (2006.01)
*H01L 21/3213* (2006.01)
*H01L 21/3105* (2006.01)

(52) U.S. Cl.
CPC .... *H01L 21/823431* (2013.01); *H01L 21/764* (2013.01); *H01L 21/823481* (2013.01); *H01L 21/31055* (2013.01); *H01L 21/32055* (2013.01); *H01L 21/32139* (2013.01); *H01L 21/823418* (2013.01)

(58) Field of Classification Search
None
See application file for complete search history.

(56) References Cited

U.S. PATENT DOCUMENTS

2021/0288046 A1* 9/2021 Reznicek ............ H01L 23/4821

* cited by examiner

Primary Examiner — Jack S Chen
(74) Attorney, Agent, or Firm — Alston & Bird LLP

(57) ABSTRACT

The disclosure includes forming a SiGe region on two adjacent fin structures and a SiP region on the fin structures adjacent to the SiGe region; forming SDB trenches; forming SiN plugs over the SDB trenches to make top-sealed hollow SDB trenches. The process for forming SDB trenches adds no additional cost, and the process is compatible with existing process flow. The SiN plugs are configured to seal the SDB trenches from top, such that the SDB trenches are filled with air and do not need to be thermally annealed. The advantage includes low fin loss in the annealing oxidation process and better controlled uniformity of the SDB trenches. Air in the SDB trenches reduces the parasitic capacitance of adjacent contacts, therefore and it is conducive to improving the device speed.

8 Claims, 7 Drawing Sheets

METHOD FOR MAKING SELF-ALIGNED POST-CUT SDB FINFET DEVICE

CROSS-REFERENCES TO RELATED APPLICATIONS

This application claims priority to Chinese patent application No. CN 202010729632.7, filed on Jul. 27, 2020 at CNIPA, and entitled "METHOD FOR MAKING SELF-ALIGNED POST-CUT SDB FINFET DEVICE", the disclosure of which is incorporated herein by reference in entirety.

TECHNICAL FIELD

The disclosure relates to the technical field of semiconductors, and in particular, to a method for making a self-aligned post-cut SDB FinFET device.

BACKGROUND

Logic design in a logic standard cell is created by using a standard cell. The height of the cell is a product of the number of tracks in the cell multiplied by the metal pitch of a chosen layer, here the tracks and pitch are measured by using the second metal layer (M2). FIG. 1 illustrates a schematic diagram of a 7.5 track cell. Half of the height between power and ground is located in the upper cell and the other half in the lower cell respectively.

The cell width is related to the number of Contact Poly Pitch (CPP). The number of CPPs forming the cell width depends on the cell type and whether the cell has Double Diffusion Break (DDB) or Single Diffusion Break (SDB).

For each DDB, one and a half CPPs are added to each side of the cell. For a practical cell, such as an NAND gate and a cell scanning trigger, the number of CPPs for a DDB process forming the cell width can large. However, SDB has little influence on DDB.

If fin loss is large in an annealing process post FCVD (flowable chemical vapor deposition), the channel CD will expand, so the polysilicon gate cannot cover a SDB well, therefore affecting the subsequent SiGe (silicon germanium) and SiP (silicon phosphate) epitaxial growth. Therefore, the key problem is how to control the fin loss in the FCVD annealing process.

In view of the disadvantages in the prior art, the purpose of the disclosure is to provide a method for making a self-aligned post-cut SDB FinFET device, the method will be applied to reduce the fin loss in an FCVD annealing process in the manufacturing of a FinFET device in the prior art.

BRIEF SUMMARY

Embodiments of the disclosure provide a method for making a self-aligned post-cut SDB FinFET device. The method for making the self-aligned post-cut SDB FinFET device at least includes the following steps:

step 1: forming a plurality of fin structures located on a substrate and arranged in parallel along a transverse direction, wherein a SiN layer is disposed on the plurality of fin structures, and wherein a first hard mask layer is disposed on the SiN layer;

step 2: depositing a thin oxide layer covering an upper surface of the substrate and sidewalls of the plurality of fin structures;

step 3: depositing an oxide dielectric layer on the SiN layer and fill between the plurality of fin structures, and performing annealing;

step 4: polishing the oxide dielectric layer to expose the SiN layer;

step 5: removing the SiN layer;

step 6: etching back the oxide dielectric layer to expose a height of the plurality of fin structures, wherein the height has a range from 30 to 90 nm;

step 7: depositing a polysilicon layer on exposed part of the plurality of fin structures, depositing a second hard mask layer on the polysilicon layer;

etching the polysilicon layer and the second hard mask layer to form a plurality of polysilicon-hard mask structures arranged in parallel along a longitudinal direction, and forming sidewalls on sides of the plurality of polysilicon-hard mask structures;

step 8: forming an SiGe region on one of the plurality of fin structures between two adjacent ones of the plurality of polysilicon-hard mask structures;

forming an SiP region on another of the plurality of fin structures between two other adjacent ones of the plurality of polysilicon-hard mask structures, wherein the SiP region and the SiGe region are configured at two sides of one of the plurality of polysilicon-hard mask structures; and depositing an ILD layer to fill a space between any two of the plurality polysilicon-hard mask structures;

step 9: removing the second hard mask layer by polishing to expose the polysilicon layer;

step 10: removing the polysilicon layer to form trenches between two adjacent ones of the plurality of polysilicon-hard mask structures;

step 11: filling a high-K dielectric material into the trenches to form high-K metal gates after the polysilicon layer is removed;

step 12: etching back the high-K metal gates;

step 13: depositing a cap layer on the back-etched high-K metal gates and performing planarization on the cap layer;

step 14: etching the plurality of fin structures to form single diffusion break (SDB) trenches; and step 15: forming SiN plugs over the SDB trenches, wherein the SiN plugs are top-sealed hollow structures.

In some examples, the method for depositing the thin oxide layer covering the upper surface of the substrate and sidewalls of the plurality of fin structures in step 2 comprises atomic layer deposition or in-situ steam generation.

In some examples the method for depositing the oxide dielectric layer in step 3 comprises fluid chemical vapor deposition.

In some examples, step 8 further comprising; performing chemical-mechanical polishing to the ILD layer to expose the second hard mask layer, after the ILD layer is deposited In some examples, the method for forming the SDB trenches in step 14 comprises performing a photolithography process first to form a photoresist pattern, defining position and morphology of the SDB trenches, and etching the cap layer, the high-K metal gates and the plurality of fin structures below the high-K metal gates according to the photoresist pattern to form the SDB trenches.

In some examples, the method for forming the SiN plugs in step 15 comprises depositing a SiN layer first into the SDB trenches, and performing chemical-mechanical polishing to planarize a top surface of the SiN layer to form the SiN plugs.

In some examples, the method further comprises step 16: depositing a dielectric layer, and etching the dielectric layer to form a contact hole, wherein the contact hole is located above the SiGe region and the SiP region.

In some examples, the method further comprises step 17: filling a metal into the contact hole to form a metal contact.

As described above, the method for making the self-aligned post-cut SDB FinFET device provided by the disclosure has the following beneficial effects: the standard growth process of SiGe and SiP is not affected, keeping forming SiGe region and SiP region process in high quality; and the process of forming SDB adopts the metal gate-hard mask-cap layer-hard mask process, so no additional cost is introduced, and the process compatibility with current tools is good. At the same time, since the SDB etching process is self-aligned, the process change can be better controlled. After the SDB trenches are formed, a pullback process is performed to expand the top openings of the SDB trenches. The SiN plugs are arranged to seal the SDB trenches leaving the SDB trenches filled with air instead of oxide, which does not require thermal annealing, so there is almost no fin loss in the annealing oxidation process and the uniformity of the SDB trenches can be better controlled. Air in the SDB trenches reduces parasitic capacitance of adjacent contacts, and it is conducive to improving the device speed.

DETAILED DESCRIPTION OF THE DISCLOSURE

The embodiments of the disclosure will be described below through specific examples, and those skilled in the art can easily understand other advantages and effects of the disclosure from the content disclosed in the description. The disclosure may also be implemented or applied through other different specific embodiments, and various details in the description may also be modified or changed based on different viewpoints and applications without departing from the spirit of the disclosure.

It should be noted that the drawings provided in the embodiments are only used for schematically describing the basic concept of the disclosure, thus only illustrate components related to the disclosure, and are not drawn according to the number, shape and size of the components in the actual implementation. The form, number and scale of the components in the actual implementation may be freely changed and the layout of the components may be more complex.

Figure 1:
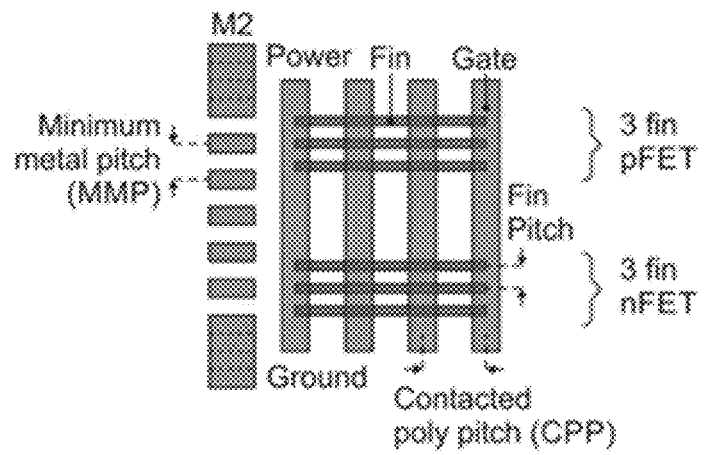
FIG. 1 illustrates a schematic diagram of a 7.5 track cell.
Figure 2A:
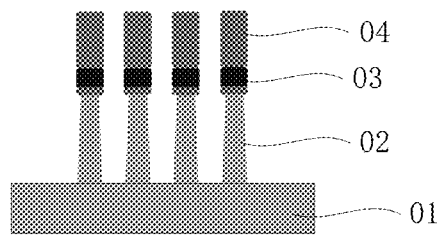
FIG. 2a illustrates a schematic transverse cross-sectional view of a fin structure after a SiN layer and a first hard mask layer are provided according to the current disclosure.
Figure 2B:
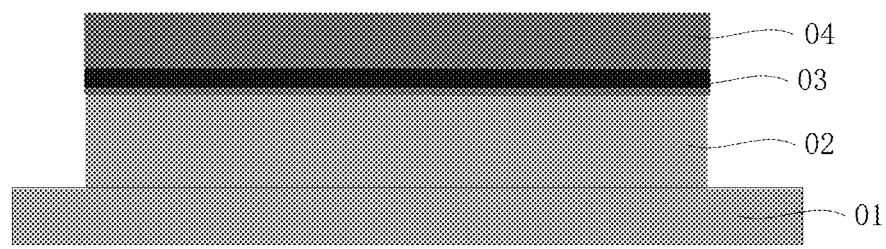
FIG. 2b illustrates a schematic longitudinal cross-sectional view of the fin structural after the SiN layer and the first hard mask layer are provided according to the current disclosure.

The disclosure provides a method for making a self-aligned post-cut SDB FinFET device. The method for making the self-aligned post-cut SDB FinFET device at least includes the following steps:

In step 1, a plurality of fin structures are located on a substrate and arranged in parallel extending in a transverse (fins are horizontally aligned) direction. The fin structures are provided with a SiN (silicon nitride) layer, and the SiN layer is provided with a first hard mask layer. Referring to FIG. 2a and FIG. 2b, FIG. 2a illustrates a schematic transverse cross-sectional view of the fin structures after the SiN layer and the first hard mask layer are disposed according to the disclosure. FIG. 2b illustrates a schematic longitudinal cross-sectional view after the SiN layer and the first hard mask layer are provided on the fin structures according to the disclosure. A plurality of fin structures 02 spaced from each other are formed on a substrate 01, the upper surfaces of the fin structures 02 are provided with the SiN layer 03, and the SiN layer 03 is provided with a first hard mask layer 04, between the fin structures 02 and the SiN layer 03 is a oxide dielectric layer.

Figure 3A:
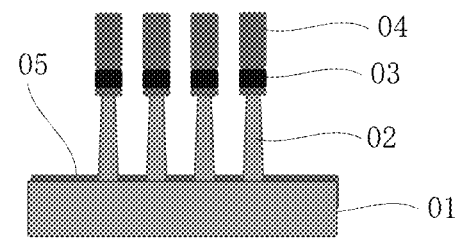
FIG. 3a illustrates a schematic transverse cross-sectional view of a fin structural structure after the thin oxide layer is deposited on the upper surface of the substrate and fin's sidewalls according to the current disclosure.
Figure 3B:
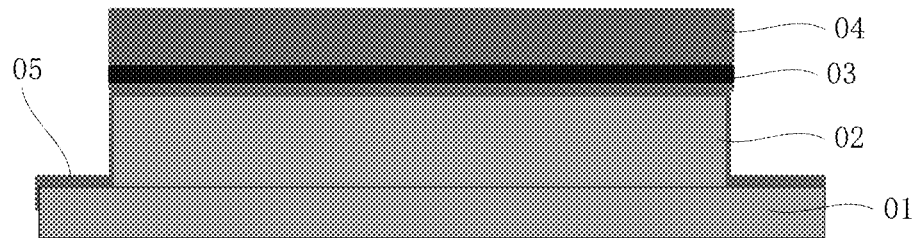
FIG. 3b illustrates a schematic longitudinal cross-sectional view of the fin structure after the thin oxide layer is deposited on an upper surface of a substrate and fin's sidewalls according to the current disclosure.

In step 2, a thin oxide layer covering the upper surface of the substrate and the sidewalls of the fin structures is deposited. Referring to FIG. 3a and FIG. 3b, FIG. 3a illustrates a schematic transverse cross-sectional view of the fin structures after the thin oxide layer is deposited on the upper surface of the substrate and the sidewalls of the fin structures according to the disclosure, and FIG. 3b illustrates a schematic longitudinal cross-sectional view after the thin oxide layer is deposited on the upper surface of the substrate and the sidewalls of the fin structures. Further, a method for depositing the thin oxide layer covering the upper surface of the substrate 01 and the sidewalls of the fin structures 02 in step 2 is Atomic Layer Deposition (ALD) or In-Situ Steam Generation (ISSG).

Figure 4A:
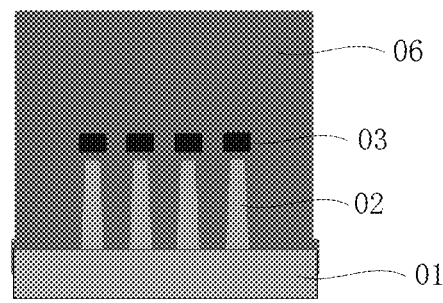
FIG. 4a illustrates a schematic transverse cross-sectional view of the fins after depositing the oxide dielectric layer to fill between the fin structures on top of the SiN layer which covers the fin structures in the current disclosure.
Figure 4B:
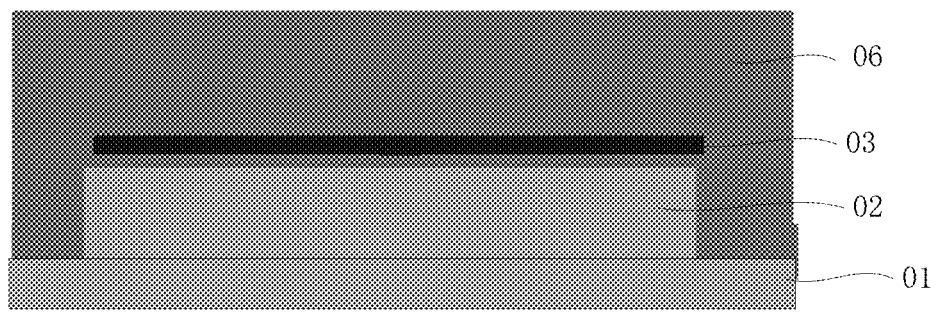
FIG. 4b illustrates a schematic longitudinal cross-sectional view after depositing the oxide dielectric layer to fill between the fin structures on top of the SiN layer which covers the fin structures in the current disclosure.

In step 3, an oxide dielectric layer is deposited to fill between the fin structures and to cover the SiN layer on top of the fin structures, and followed by annealing. Referring to FIG. 4a and FIG. 4b, FIG. 4a illustrates a structural schematic transverse cross-sectional view after the oxide dielectric layer 06 has filled between the fin structures 02 and on top of the SiN 03 which covers the top surfaces of the fin structures 02 on the substrate 01in the current disclosure. FIG. 4b illustrates a schematic longitudinal cross-sectional view after the oxide dielectric layer 06 has filled between the fin structures 02 and on top of the SiN layer 03 which covers the top surfaces of the fin structures 02. Further, a method for depositing the oxide dielectric layer 06 in step 3 is Flowable Chemical Vapor Deposition (FCVD).

Figure 5A:
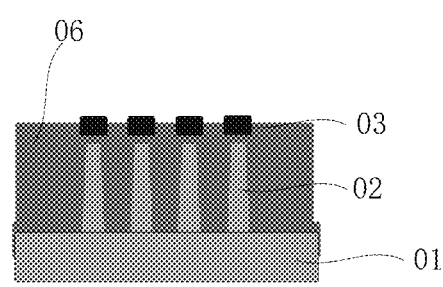
FIG. 5a illustrates a schematic transverse cross-sectional view of the fin structures after the top of the SiN layer is exposed post polishing the oxide dielectric layer in the current disclosure.
Figure 5B:
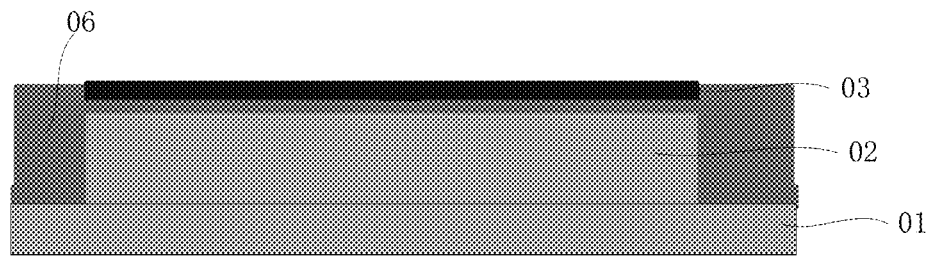
FIG. 5b illustrates a schematic longitudinal cross-sectional structural view after the top of the SiN layer is exposed post polishing an oxide dielectric layer in the disclosure.

In step 4, the oxide dielectric layer 06 is polished till the top of the SiN 03 is exposed. Referring to FIG. 5a and FIG. 5b, FIG. 5a illustrates a schematic transverse cross-sectional view of the fin structures 02 after the oxide dielectric layer 06 is polished till the top of the SiN layer 03 is exposed in the disclosure, and FIG. 5b illustrates a schematic longitudinal cross-sectional view after the oxide dielectric layer 06 is polished till the top of the SiN layer 03 is exposed. Further, in step 4, Chemical-Mechanical Polishing (CMP) is adopted to polish the oxide dielectric layer 06.

Figure 6A:
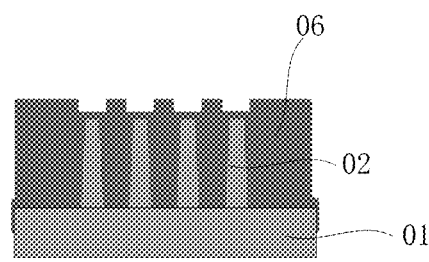
FIG. 6a illustrates a schematic transverse cross-sectional view after the SiN layer is removed from the fin structures in the current disclosure.
Figure 6B:
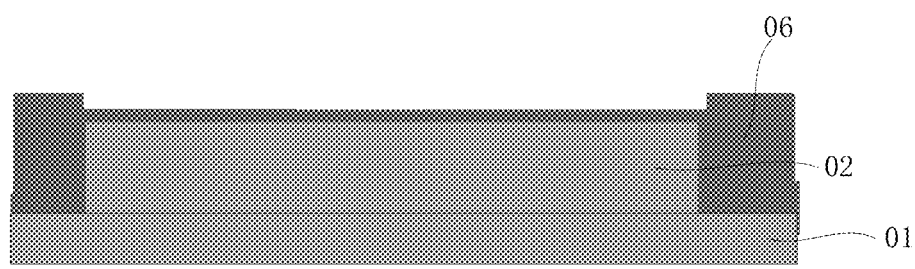
FIG. 6b illustrates a schematic longitudinal cross-sectional view after the SiN layer on the fin structures is removed in the current disclosure.

In step 5, the SiN layer 03 is removed. Referring to FIG. 6a and FIG. 6b, FIG. 6a illustrates a schematic transverse cross-sectional view of the fin structures 02 after the SiN layer 03 is removed from the top of the fin structures 02 according to the current disclosure. FIG. 6b illustrates a schematic longitudinal cross-sectional view after the SiN layer 03 is removed from the fin structures 02

Figure 7A:
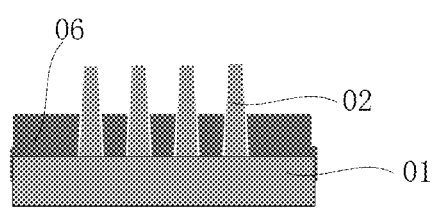
FIG. 7a illustrates a schematic transverse cross-sectional view of the fin structures after the oxide dielectric layer is etched back in the current disclosure.
Figure 7B:
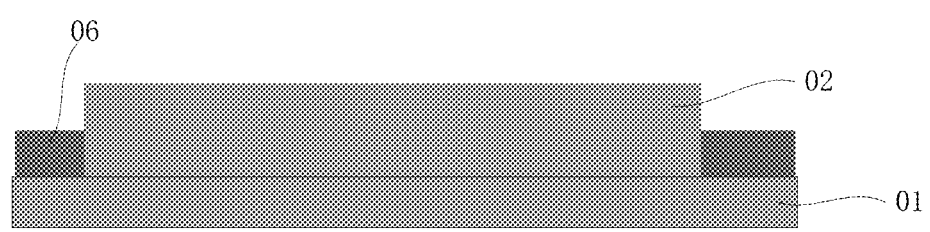
FIG. 7b illustrates a schematic longitudinal cross-sectional view after the oxide dielectric layer is etched back in the current disclosure.

In step 6, the oxide dielectric layer 06 is etched back to expose the fin structures 02 up to the height in a range of 30 to 90 nm. Referring to FIG. 7a and FIG. 7b, FIG. 7a illustrates a schematic transverse cross-sectional view of the fin structures 02 after the oxide dielectric layer 06 is etched back according to the current disclosure. FIG. 7b illustrates a schematic longitudinal cross-sectional view after the oxide dielectric layer 06 is etched back in the disclosure.

Figure 8A:
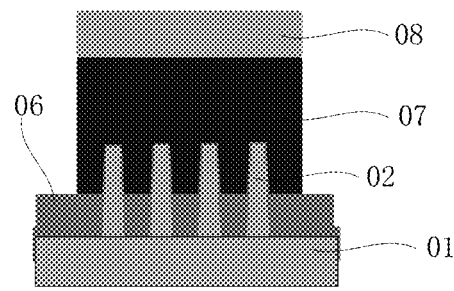
FIG. 8a illustrates a schematic transverse cross-sectional view of the fin structures after the polysilicon-hard mask structures are formed in the current disclosure.
Figure 8B:
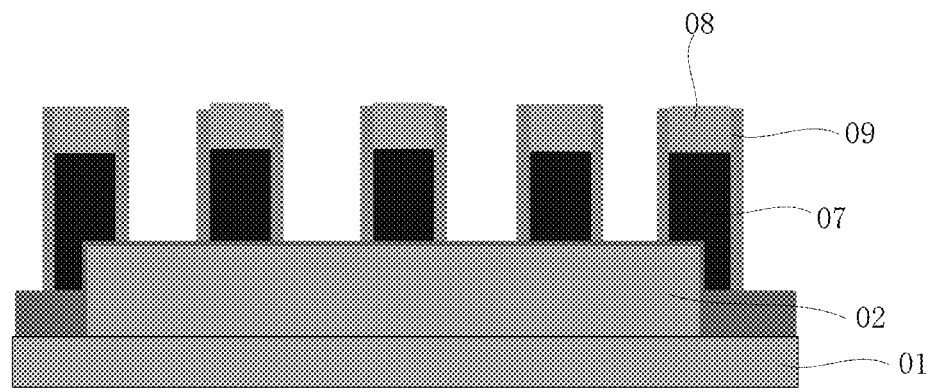
FIG. 8b illustrates a schematic longitudinal cross-sectional view after the polysilicon-hard mask structures are formed in the current disclosure.

In step 7, a polysilicon layer is deposited on the exposed fin structures, a second hard mask layer is formed on the polysilicon layer; then the polysilicon layer and the second hard mask layer are etched to form a plurality of polysilicon-hard mask structures arranged in a longitudinal direction, and sidewalls are formed on the sidewalls of the polysilicon-hard mask structures. Referring to FIG. 8a and FIG. 8b, FIG. 8a illustrates a schematic transverse cross-sectional view after the polysilicon-hard mask structures are formed according to the current the disclosure, and FIG. 8b illustrates a schematic longitudinal cross-sectional view after the polysilicon-hard mask structures are formed in the disclosure. In FIG. 8a, after the oxide dielectric layer 06 is etched back in step 6, a part of the fin structures 02 is exposed, and the polysilicon layer 07 deposited in step 7 covers the exposed fin structures 02; next a second hard mask layer (HM) 08 is formed on the polysilicon layer 07, followed by the polysilicon layer 07 and the second hard mask layer (HM) 08 being etched at the same time. Referring to FIG. 8b, from the longitudinal view of the structure, the polysilicon layer 07 and the second hard mask layer (HM) 08 are etched to form a plurality of independent structures (i.e., the polysilicon-hard mask structures) arranged in the longitudinal direction (i.e., the direction perpendicular to the transverse cross section in FIG. 8a. Each of the polysilicon-hard mask structures consists of a polysilicon layer 07 and a second hard mask layer 08 on the polysilicon layer 07. Next, the sidewalls 09 of the polysilicon-hard mask structures in FIG. 8b are formed on the sides of the polysilicon at lower part and hard mask layer on the upper part. When the sidewalls 09 are formed, the exposed fin structures 02 are also coated with the sidewalls 09, which are not shown in FIG. 8a.

Figure 9:
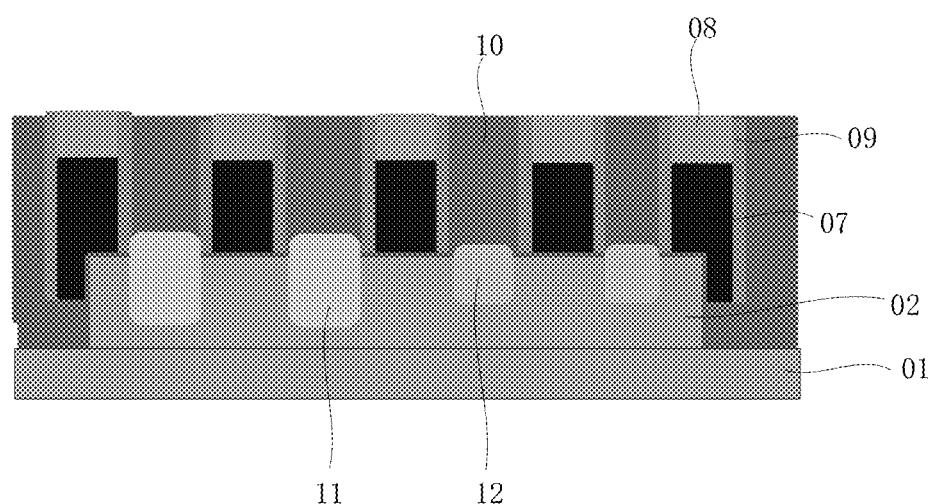
FIG. 9 illustrates a longitudinal cross-sectional schematic view after an SiGe region, an SiP region and an ILD (interlayer dielectric) layer are formed in the current disclosure.

In step 8, an SiGe region is formed on the fin structures between two adjacent sidewalls of the polysilicon-hard mask structures, and an SiP region is formed on the fin structures between two sidewalls of the polysilicon-hard mask structures adjacent to the SiGe region; followed by an ILD layer deposition to fill the space between the adjacent polysilicon-hard mask structures. Further, after the ILD layer is deposited to fill the space between the polysilicon-hard mask structures in step 8, chemical-mechanical polishing is performed to the ILD layer till the hard mask layer is exposed. Referring to FIG. 9, which illustrates a schematic longitudinal cross-sectional view after the SiGe region 11, the SiP region 12 and the ILD layer 10 are formed according to the disclosure. The SiGe region 11 is formed on the fin structures 02 between the two polysilicon-hard mask structures, and the SiP region 12 is formed on the fin structures 02 between the two polysilicon-hard mask structures adjacent to the SiGe region 11. In other embodiments of the disclosure, a plurality of SiGe regions and SiP regions may be formed differently, that is, SiGe regions are located on one side of the plurality of SiP regions.

Continue to refer to FIG. 9, after the SiGe region 11 and the SiP region 12 are formed in step 8, the ILD layer 10 is deposited to fill the space between the polysilicon-hard mask structures.

Figure 10:
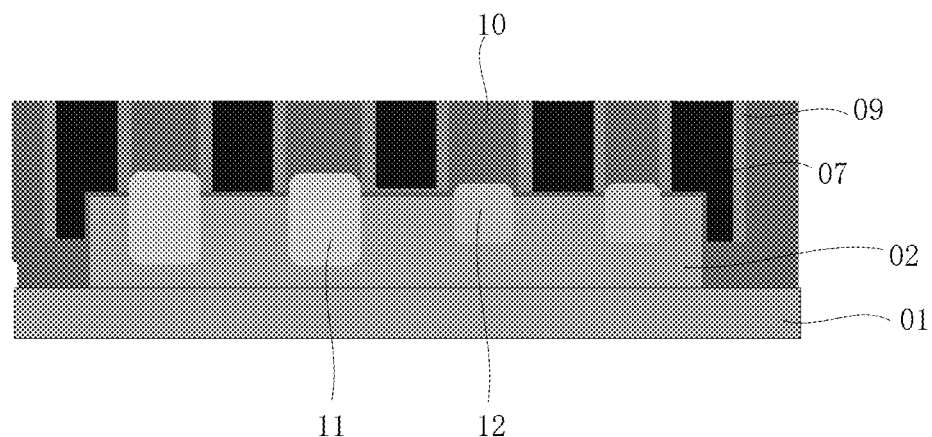
FIG. 10 illustrates a schematic longitudinal cross-sectional view after a polysilicon layer is removed in the current disclosure.

In step 9, the second hard mask layer 08 on the polysilicon layer 07 is removed by polishing till the polysilicon layer 07 is exposed. Referring to FIG. 10, it illustrates a schematic longitudinal cross-sectional view after the polysilicon layer 07 is removed in the disclosure.

Figure 11:
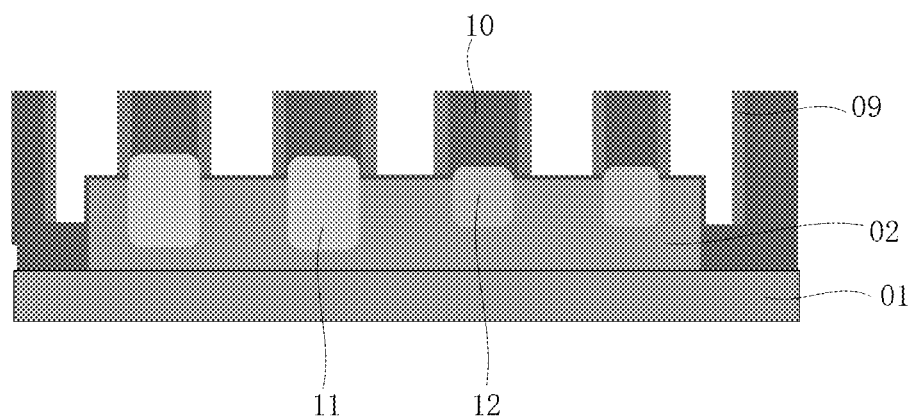
FIG. 11 illustrates a schematic longitudinal cross-sectional view after the polysilicon layer is removed and trenches are formed in the current disclosure.

In step 10, the polysilicon layer 07 is removed to form trenches. Referring to FIG. 11, which illustrates a schematic longitudinal cross-sectional view after the polysilicon layer 07 is removed and trenches are formed according to the current disclosure. After the polysilicon layer 07 is removed in this step, trenches are left between every two adjacent sidewalls 09.

Figure 12:
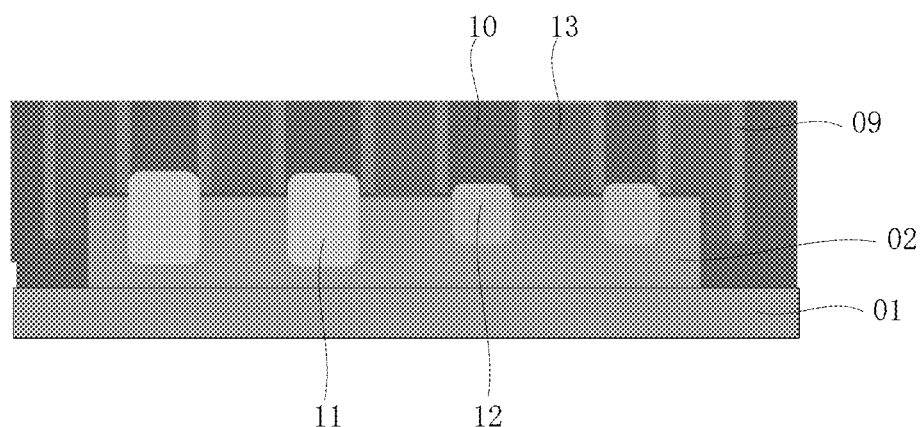
FIG. 12 illustrates a schematic longitudinal cross-sectional view after an HK (high K) layer is filled into the trenches to form metal gates in the current disclosure.

In step 11, a high-K (HK) dielectric material is filled into the trenches to form metal gates after the polysilicon layer is removed. Referring to FIG. 12, which illustrates a schematic longitudinal cross-sectional view after an HK dielectric material layer is filled into trenches to form the high-K metal gates (HKMG) 13 according to the current disclosure.

Figure 13:
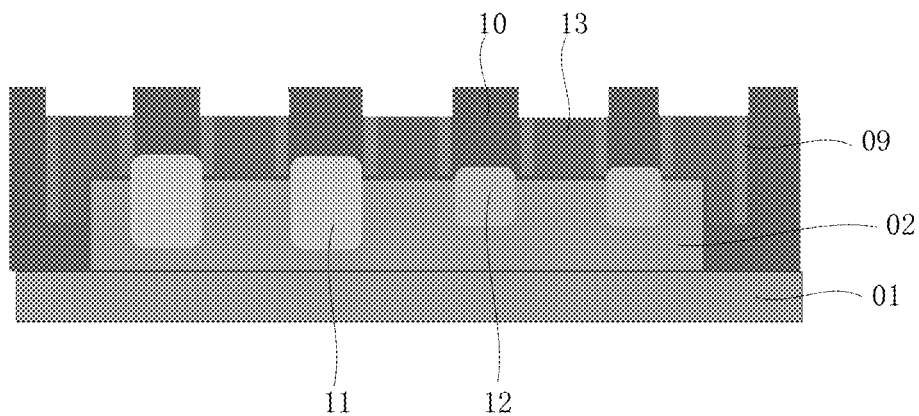
FIG. 13 illustrates a schematic longitudinal cross-sectional view after the metal gates are etched back in the current disclosure.

In step 12, the HK metal gates are etched back. Referring to FIG. 13, which illustrates a schematic longitudinal-sectional view after the HK metal gates are etched back in the disclosure. After the HK metal gates 13 are etched back in this step, trenches are formed in the back-etched HK metal gates 13 between the ILD layers 10. These trenches will hold a cap layer subsequently.

Figure 14:
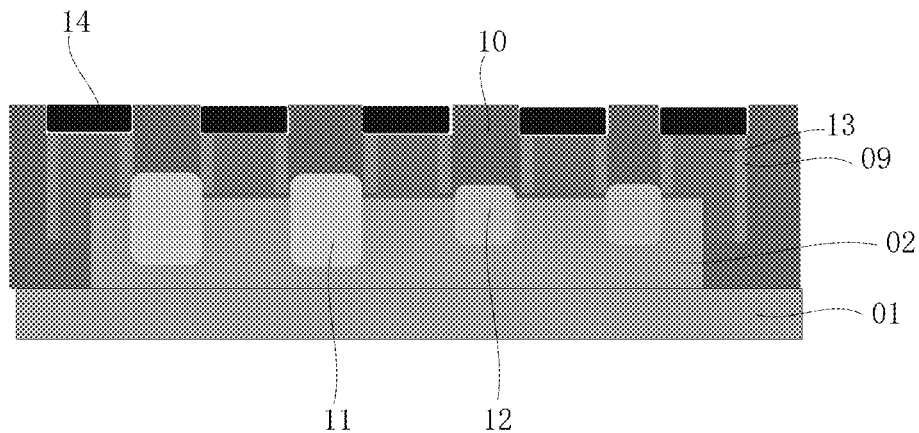
FIG. 14 illustrates a schematic longitudinal cross-sectional view after a cap layer is formed on the metal gates in the current disclosure.

In step 13, a cap layer is formed on the back-etched HK metal gates followed by planarization. Referring to FIG. 14, which illustrates a schematic longitudinal cross-sectional view after a cap layer is formed on the HK metal gates according to the current disclosure. In this step, a cap layer 14 is deposited first to cover the ILD layer 10 and fills the trenches in the HK metal gates 13, then the cap layer 14 is planarized, by polishing the cap layer 14 till the upper surface of the ILD layer 10 is exposed, thus forming the structure in FIG. 14.

Figure 15:
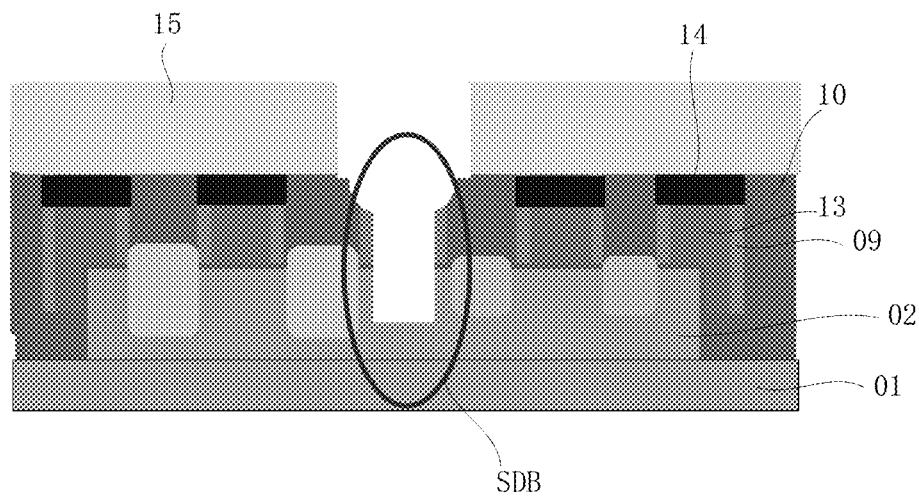
FIG. 15 illustrates a schematic longitudinal cross-sectional view after the SDB trenches are formed in the current disclosure.

In step 14, the fin structures are etched to form SDB trenches. Referring to FIG. 15, which illustrates a schematic longitudinal cross-sectional view of the fin structures after the SDB trenches are formed according to the current disclosure.

Further, a method for forming the SDB trenches in step 14 includes: first, performing a photolithography process (exposure and development) to form a photoresist pattern 15, defining the position and morphology of the SDB trenches, and second, etching the cap layer 14, the HK metal gates 13 and the fin structures 02 below the HK metal gates 13 defined by the photoresist pattern 15 to form the SDB trenches. Those of the cap layer 14, the HK metal gates 13 and the fin structures 02 below the HK metal gates 13 which are etched in this step 14 only refer to portions of the cap layer 14 between the SiGe region 11 and one of the SiP region 12 adjacent to the SiGe region 11. As a result, these selected HK metal gates 13 and the fin structures 02 below that HK metal gates 13, and each SDB trench have upper openings formed after etching.

Figure 16:
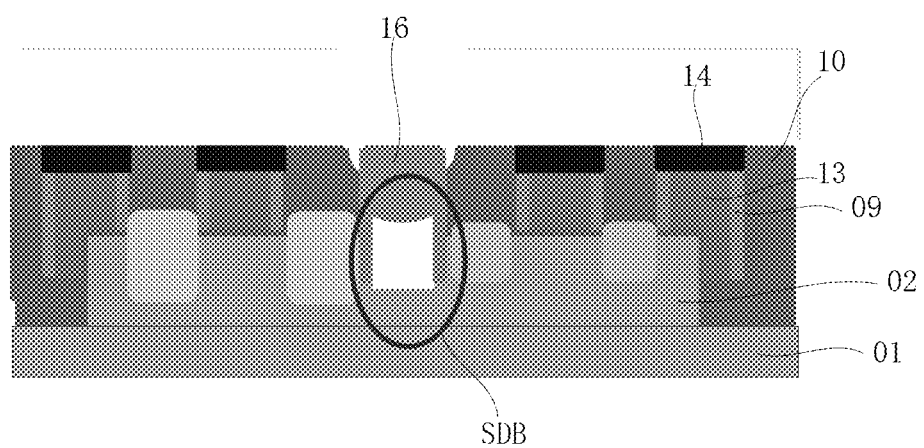
FIG. 16 illustrates a schematic longitudinal cross-sectional view after SiN plugs are formed at the top of SDB trenches in the current disclosure.

In step 15, a SiN plug is formed at the top of each of the SDB trench to form a top-sealed hollow SDB trench 16 as in FIG. 16, which illustrates a schematic longitudinal cross-sectional view after the SiN plug is formed at the top of the SDB trench according to the disclosure.

Further, a method for forming the SiN plugs in step 15 includes: first, depositing a SiN layer to fill the top of the SDB trenches, and second, performing chemical-mechanical polishing (CMP) to planarize the surface of the SiN layer to form the SiN plugs. In step 15, after the SiN plugs are formed at the top of the SDB trenches, there exists a hollow region in each of SDB trenches below the SiN plug 16, thus, top-sealed hollow SDB trenches (a hollow region is full of air) are formed in step 15.

The method further includes step 16: depositing a dielectric layer, and then etching the dielectric layer to form a contact hole. The contact hole is located above the SiGe region and the SiP region.

The method further includes step 17: filling a metal into the contact hole (CT) to form a metal contact.

To sum up, in the current disclosure, the current growth process of the SiGe and SiP is not affected, resulting in compactable SiGe region and SiP region. The process of forming SDB regions integrates the HK metal gate-hard mask-cap layer-hard mask process, no additional cost is introduced, and the process compatibility is guaranteed. At the same time, the process change can be well controlled since the SDB etching process is self-aligned. In this process, the SiN plugs are filled to seal the SDB trenches. The SDB trenches have air filled pockets instead of oxide filings, thereby do not require thermal annealing. As a result, there is almost no fin loss in the annealing oxidation process and better uniformity of the SDB trenches is achieved. Since the SDB trenches are filled with air, parasitic capacitance between adjacent contacts can be reduced, thus, it is conducive to improving the device speed. Therefore, the disclosed technique effectively overcomes various disadvantages in the prior art, thus achieves a significantly more industrial utilization value.

The above embodiments are used for describing the principle and effect of the disclosure only, instead of limiting the disclosure. Those skilled in the art may modify or change the above embodiments without going beyond the spirit and scope of the disclosure. Therefore, all equivalent modifications or changes made by those skilled in the art without departing from the spirit and technical concept disclosed in the disclosure shall still be covered by the claims of the disclosure.

What is claimed is:

1. A method for making a self-aligned post-cut SDB FinFET device, wherein the method comprises:
    step 1: forming a plurality of fin structures located on a substrate and arranged in parallel along a transverse direction, wherein a SiN layer is disposed on the plurality of fin structures, and wherein a first hard mask layer is disposed on the SiN layer;
    step 2: depositing a thin oxide layer covering an upper surface of the substrate and sidewalls of the plurality of fin structures;
    step 3: depositing an oxide dielectric layer on the SiN layer and fill between the plurality of fin structures, and performing annealing;
    step 4: polishing the oxide dielectric layer to expose the SiN layer;
    step 5: removing the SiN layer;
    step 6: etching back the oxide dielectric layer to expose a height of the plurality of fin structures, wherein the height has a range from 30 to 90 nm;
    step 7: depositing a polysilicon layer on exposed part of the plurality of fin structures, depositing a second hard mask layer on the polysilicon layer;
    etching the polysilicon layer and the second hard mask layer to form a plurality of polysilicon-hard mask structures arranged in parallel along a longitudinal direction, and forming sidewalls on sides of the plurality of polysilicon-hard mask structures;
    step 8: forming an SiGe region on one of the plurality of fin structures between two adjacent ones of the plurality of polysilicon-hard mask structures;
    forming an SiP region on another of the plurality of fin structures between two other adjacent ones of the plurality of polysilicon-hard mask structures, wherein the SiP region and the SiGe region are configured at two sides of one of the plurality of polysilicon-hard mask structures; and
    depositing an ILD layer to fill a space between any two of the plurality polysilicon-hard mask structures;
    step 9: removing the second hard mask layer by polishing to expose the polysilicon layer;

step 10: removing the polysilicon layer to form trenches between two adjacent ones of the plurality of polysilicon-hard mask structures;

step 11: filling a high-K dielectric material into the trenches to form high-K metal gates after the polysilicon layer is removed;

step 12: etching back the high-K metal gates;

step 13: depositing a cap layer on the back-etched high-K metal gates and performing planarization on the cap layer;

step 14: etching the plurality of fin structures to form single diffusion break (SDB) trenches; and step 15: forming SiN plugs over the SDB trenches, wherein the SiN plugs are top-sealed hollow structures.

2. The method for making the self-aligned post-cut SDB FinFET device according to claim 1, wherein the method for depositing the thin oxide layer covering the upper surface of the substrate and sidewalls of the plurality of fin structures in step 2 comprises atomic layer deposition or in-situ steam generation.

3. The method for making the self-aligned post-cut SDB FinFET device according to claim 1, wherein the method for depositing the oxide dielectric layer in step 3 comprises fluid chemical vapor deposition.

4. The method for making the self-aligned post-cut SDB FinFET device according to claim 1, step 8 further comprising; performing chemical-mechanical polishing to the ILD layer to expose the second hard mask layer, after the ILD layer is deposited.

5. The method for making the self-aligned post-cut SDB FinFET device according to claim 1, wherein the method for forming the SDB trenches in step 14 comprises performing a photolithography process first to form a photoresist pattern, defining position and morphology of the SDB trenches, and etching the cap layer, the high-K metal gates and the plurality of fin structures below the high-K metal gates according to the photoresist pattern to form the SDB trenches.

6. The method for making the self-aligned post-cut SDB FinFET device according to claim 1, wherein the method for forming the SiN plugs in step 15 comprises depositing a SiN layer first into the SDB trenches, and performing chemical-mechanical polishing to planarize a top surface of the SiN layer to form the SiN plugs.

7. The method for making the self-aligned post-cut SDB FinFET device according to claim 1, wherein the method further comprises step 16: depositing a dielectric layer, and etching the dielectric layer to form a contact hole, wherein the contact hole is located above the SiGe region and the SiP region.

8. The method for making the self-aligned post-cut SDB FinFET device according to claim 7, wherein the method further comprises step 17: filling a metal into the contact hole to form a metal contact.

* * * * *